US012804933B2

(12) United States Patent
Stein et al.

(10) Patent No.: US 12,804,933 B2
(45) Date of Patent: Nov. 17, 2026

(54) VERTICAL ORIENTED SEMICONDUCTOR DEVICE COMPRISING WELL REGIONS HAVING A LATERAL DOPING GRADIENT WITH MONOTONIC DECREASING DOPING CONCENTRATION, AS WELL AS A CORRESPONDING METHOD OF MANUFACTURING SUCH A VERTICAL ORIENTED SEMICONDUCTOR DEVICE

(71) Applicant: NEXPERIA B.V., Nijmegen (NL)

(72) Inventors: Falk-Ulrich Stein, Hamburg (DE); Jakob Teichrib, Hamburg (DE)

(73) Assignee: Nexperia B.V., Nijmegen (NL)

( * ) Notice: Subject to any disclaimer, the term of this patent is extended or adjusted under 35 U.S.C. 154(b) by 490 days.

(21) Appl. No.: 18/355,472

(22) Filed: Jul. 20, 2023

(65) Prior Publication Data

US 2024/0030315 A1 Jan. 25, 2024

(30) Foreign Application Priority Data

Jul. 22, 2022 (EP) .................................... 22186430

(51) Int. Cl.
*H10D 30/01* (2025.01)
*H10D 30/66* (2025.01)
(Continued)

(52) U.S. Cl.
CPC ......... *H10D 30/0291* (2025.01); *H10D 30/66* (2025.01); *H10D 62/393* (2025.01); *H10D 62/8325* (2025.01)

(58) Field of Classification Search
CPC ........ H10D 30/0291–0297; H10D 30/66–669; H10D 62/152–153; H10D 62/156–157;
(Continued)

(56) References Cited

U.S. PATENT DOCUMENTS

2009/0020834 A1* 1/2009 Ootsuka ............... H10D 12/031 438/278
2012/0261715 A1 10/2012 Kim et al.
(Continued)

*Primary Examiner* — Wael M Fahmy
*Assistant Examiner* — Quinton A Brasfield
(74) *Attorney, Agent, or Firm* — Ruggiero McAllister McMahon LLC

(57) ABSTRACT

A vertical oriented semiconductor device is provided. The semiconductor device includes a semiconductor body having a first major surface, the semiconductor device includes a current-accommodating region of a first conductivity type, well regions of a second conductivity type, at or near the first major surface, the second conductivity type opposite to the first conductivity type, the well regions laterally adjacent sides of the current-accommodating region, the well regions having a first depth into the semiconductor body, a substrate region, provided at a second major surface vertically opposite to the first major surface, the substrate region being of the first conductivity type, and at least one of the well regions has a lateral doping gradient with monotonic decreasing doping concentration, from a higher doping concentration at a first lateral end of the well regions towards a lower doping concentration at a second, opposite, lateral end thereof facing the current-accommodating region.

19 Claims, 3 Drawing Sheets

(51) Int. Cl.
*H10D 62/17* (2025.01)
*H10D 62/832* (2025.01)

(58) Field of Classification Search
CPC ....... H01L 21/0415; H01L 21/046–047; H01L 21/2253; H01L 21/265–266; H01L 21/3115–31155; H01L 21/3215–32155; H01L 21/425–426; H01L 21/76825; H01L 21/76859; H01L 21/76862; H01L 21/0257–02584; C23C 14/48
See application file for complete search history.

(56) References Cited

U.S. PATENT DOCUMENTS

| | | | | |
|---|---|---|---|---|
| 2020/0105529 | A1* | 4/2020 | Ghandi ................ | H10D 12/032 |
| 2022/0336219 | A1* | 10/2022 | Miwa .................. | H10D 12/031 |

* cited by examiner

VERTICAL ORIENTED SEMICONDUCTOR DEVICE COMPRISING WELL REGIONS HAVING A LATERAL DOPING GRADIENT WITH MONOTONIC DECREASING DOPING CONCENTRATION, AS WELL AS A CORRESPONDING METHOD OF MANUFACTURING SUCH A VERTICAL ORIENTED SEMICONDUCTOR DEVICE

CROSS-REFERENCE TO RELATED APPLICATIONS

This application claims the benefit under 35 U.S.C. § 119(a) of European Application No. 22186430.9 filed Jul. 22, 2022, the contents of which are incorporated by reference herein in their entirety.

BACKGROUND

1. Field of the Disclosure

The present disclosure is directed to vertical oriented semiconductor devices and, more specifically, to vertical oriented semiconductor devices like transistors or diodes in which well regions are created in a semiconductor body.

2. Description of the Related Art

Vertical oriented semiconductor devices are often used for power applications. In such devices, the main current flow is oriented vertically, meaning perpendicular to the semiconductor device surface. In case of a transistor, drain contacts may thus be placed at the bottom side of the vertical oriented transistor. The elementary transistor cells can be placed side by side on a particular chip and can be connected in parallel. This is a common method to achieve a high current component and is therefore especially useful for discrete high current power device.

Conventionally, semiconductor devices were manufactured in silicon-based material. There is however a trend noticeable in which the vertical oriented semiconductor devices are manufactured in silicon carbide-based material. Such type of material may provide better performance, especially for high-power and/or high-voltage semiconductor devices.

A Silicon Carbide based semiconductor device may, for example, have multiple advantages over a conventional Silicon based semiconductor device such as a higher critical breakdown field, a higher thermal conductivity and a wider bandgap.

Reducing the cell size of a vertical oriented transistor, for example a Metal Oxide Semiconductor, MOS, Field Effect Transistor, MOSFET, and thereby increasing the channel density per area is one of the main ways to increase the conduction performance of the devices. This reduction of the cell size is often limited by manufacturing accuracy and required space in between adjacent body implants to avoid a pinch off. To counter the reduction in conduction performance, local doping variations are used especially in the area between the body implants. These doping variations may also impact the parasitic electric properties of the device and thereby also the dynamic device performance. In addition to the parasitics, the electric field distribution may be strongly changed by doping variations and may result in a change of device robustness. Achieving the balance of conduction performance, electric parasitics and device robustness with good control in manufacturing is key to building high performing devices.

Reference is made to document US 2009/020834 and to document US 2012/261715.

SUMMARY

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

It is an object of the present disclosure to provide for a vertical oriented semiconductor device. It is a further object of the present disclosure to provide for a corresponding method.

In a first aspect, there is provided a vertical oriented semiconductor device, said semiconductor device comprising a semiconductor body having a first major surface, said semiconductor device comprising:

- a current-accommodating region of a first conductivity type;
- well regions of a second conductivity type, at or near said first major surface, said second conductivity type opposite to said first conductivity type, said well regions laterally adjacent sides of said current-accommodating region, said well regions having a first depth into said semiconductor body;
- a substrate region, provided at a second major surface vertically opposite to said first major surface, said substrate region being of said first conductivity type;
- wherein at least one of said well regions has a lateral doping gradient with monotonic decreasing doping concentration, from a higher doping concentration at a first lateral end of said well regions towards a lower doping concentration at a second, opposite, lateral end thereof facing said current-accommodating region.

The inventors have found that it may be beneficial to create a lateral doping gradient in at least one of the well regions. These doping gradients may influence any depletion zone formation and may reduce electric field crowding at the corners of the corresponding well regions. This may increase semiconductor device robustness.

In the remainder of the text, the vertical oriented semiconductor device is explained with respect to a vertical oriented Metal Oxide Semiconductor, MOS, Field Effect Transistor, MOSFET. It is however noted that the present disclosure is also directed to vertical diodes, like PN diodes or schottky diodes.

A MOSFET is typically a type of insulated gate field-effect transistor that is manufactured in a semiconductor material, for example Silicon or Silicon Carbide material. The voltage at a gate terminal determines the electrical conductivity of the device. The ability to change the electrical conductivity may be used for, for example, amplifying or switching particular electronic signals.

In accordance with the present disclosure, the well regions may also be referred to as body implants. Source connections of an opposite conductivity are usually provided in these well regions for providing the source contacts of the MOSFET. The so called current-accommodating region is provided in between the two well regions. The current-accommodating region may be considered the JFET region. The JFET region may, for example, restrict current flow when the depletion widths of the two adjacently placed well region diodes extend into the drift region of the semiconductor device, with increasing drain voltage.

The semiconductor device comprises the substrate region which is provided at the second major surface vertically opposite to the first major surface, wherein the substrate region is of the first conductivity type. The substrate region may, for example, be connected to a drain contact of the MOSFET. As such, the current will flow vertically between the source contact and the drain contact depending on a voltage applied to the gate contact. The gate contact is explained later below.

In addition to the substrate region, an EPI layer may be provided on top of the substrate region to increase the breakdown voltage of the semiconductor device, for example. The EPI layer may be of the same type of conductivity as the substrate region.

In a typical MOSFET design, a channel will be established between the source contact and the JFET region. The channel is established in a corresponding well region. On top of the channel a dielectric layer, or an oxidation layer, may be provided and on top of the oxidation layer a gate contact may be provided. A voltage applied to the gate contact may then influence the free carriers present in the well region such that a channel may be formed. This is explained in more detail with reference to FIG. 1 later below.

The present disclosure is directed to the concept that at least one of the well regions has a lateral doping gradient with monotonic decreasing doping concentration, from a higher doping concentration at a first lateral end of said well regions towards a lower doping concentration at a second, opposite, lateral end thereof facing the current-accommodating region. As mentioned above, one of the advantages thereof is that the semiconductor device is made more robust.

In an example, both said well regions have a said lateral doping gradient with monotonic decreasing doping concentration.

In a further example, the monotonic decreasing doping concentration comprises discrete steps in different doping concentrations.

As is explained with reference to the method of manufacturing a vertical oriented semiconductor device, the monotonic decreasing doping concentration may be realized by subsequent steps in the process using a plurality of masks. Using these masks, implants of the second conductivity are introduced in the semiconductor material. This will result in discrete steps of the doping concentration at the location equal to the edges of the masks that have been used.

On top of the above, the current-accommodating region may be implanted as well, for example using implants of the first conductivity.

It is noted that, in accordance with the present disclosure, the number of discrete steps and thus also the number of masks used in the process is not limited to two or any other number. A plurality of masks may be used in the manufacturing process depending on design and process parameters.

The manufacturing process may thus be controlled to realize a certain doping profile, i.e. to realize a certain doping gradient in at least one of the two well regions.

In a further example, the MOSFET is a Silicon Carbide, SiC, MOSFET. That is, the semiconductor material used in the manufacturing process is a Silicon Carbide. Silicon Carbide, SiC, MOSFETs typically exhibit higher blocking voltage, lower on state resistance and higher thermal conductivity than their silicon counterparts making them especially useful for power applications.

In another example, the first conductivity type and said second conductivity type comprises any of N-type and P-type semiconductor material.

In a second aspect of the present disclosure, there is provided a method of manufacturing a vertical oriented semiconductor device, comprising the steps of:

- providing a semiconductor body of a first conductivity type and having a first major surface and having a current-accommodating region of the first conductivity type;
- implanting free charge carriers of a second conductivity type, said second conductivity type opposite to said first conductivity type, using a second mask on said semiconductor body, such that well regions, of the second conductivity type, at opposite lateral sides of said current-accommodating region are created;
- wherein said implanting free charge carriers of said second conductivity type is performed, using said second mask and, subsequently, at least a third mask, such that at least one of said source well has a lateral doping gradient with monotonic decreasing doping concentration, from a higher doping concentration at a first lateral end of said well regions towards a lower doping concentration at a second, opposite, lateral end thereof facing said current-accommodating region.

It is noted that the advantages as explained with reference to the first aspect of the present disclosure, being the vertical oriented semiconductor device, are also applicable to the second aspect of the present disclosure, being the method of manufacturing a vertical oriented semiconductor device.

In an example, the method comprises the step of:

- implanting free charge carriers of the first conductivity type using a first mask on said semiconductor body, such that the current-accommodating region of the first conductivity type is created in said semiconductor body.

The above-described example provides a step in which the current-accommodating region is created, wherein the current-accommodating region may be considered as the JFET region of the vertical semiconductor device.

In an example, the second mask has a width larger than a width of said current-accommodating region.

In a further example, the third mask has a width smaller than a width of said second mask and smaller than a width of said current-accommodating region.

In another example, the step of implanting free charge carriers of said second conductivity type further comprises implanting free charge carriers of said second conductivity using a fourth mask, said fourth mask has a width lager than a width of said third mask and smaller than a width of said second mask.

Order of the masks is arbitrary. Mask 4 may be aligned with mask 3, i.e. grown on top of mask 3.

The above-described masks are thus utilized for creating the gradient in the well regions.

In yet another example, the method comprises the step of:

- implanting free charge carriers of said first conductivity type, using said fourth mask, with a reduced implant depth compared to implant depths of said other implanting steps, such that source contacts are provided in said well regions.

In a further example, the method further comprises any of the steps of:

- manufacturing a gate oxide;
- manufacturing a gate conduction line;
- manufacturing interlayer dielectrics;
- etching ohmic contacts.

In another example, the first conductivity type and said second conductivity type comprises any of N-type and P-type.

In an even further example, the semiconductor material is Silicon Carbide, SiC.

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The above and other aspects of the disclosure will be apparent from and elucidated with reference to the examples described hereinafter.

DETAILED DESCRIPTION

Figure 1:
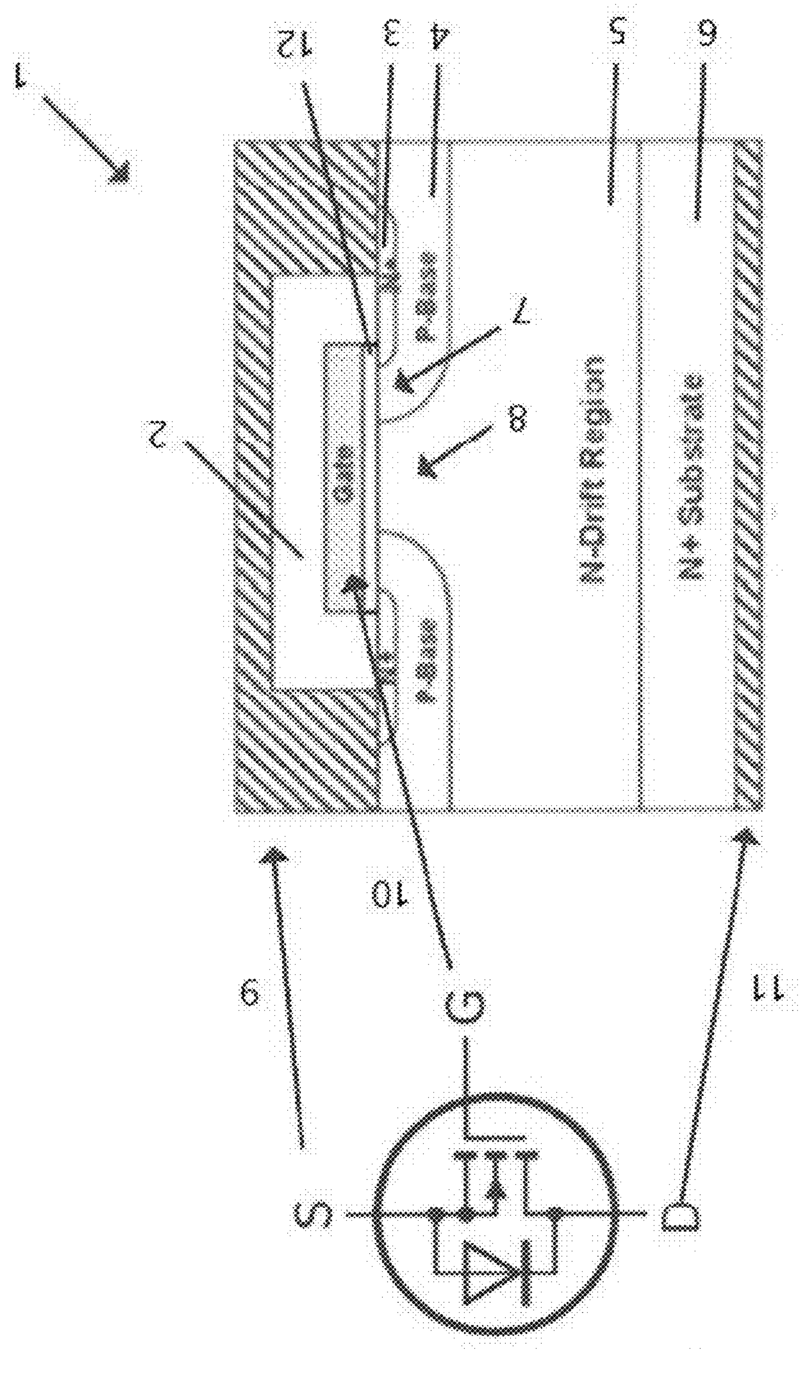
FIG. 1 discloses a schematic overview of a vertical semiconductor device being a Metal Oxide Semiconductor, MOS, Field Effect Transistor, MOSFET.

It is noted that in the description of the figures, same reference numerals refer to the same or similar components performing a same or essentially similar function.

A more detailed description is made with reference to particular examples, some of which are illustrated in the appended drawings, such that the manner in which the features of the present disclosure may be understood in more detail. It is noted that the drawings only illustrate typical examples and are therefore not to be considered to limit the scope of the subject matter of the claims. The drawings are incorporated for facilitating an understanding of the disclosure and are thus not necessarily drawn to scale. Advantages of the subject matter as claimed will become apparent to those skilled in the art upon reading the description in conjunction with the accompanying drawings.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or," in reference to a list of two or more items, covers all of the following interpretations of the word: any of the items in the list, all of the items in the list, and any combination of the items in the list.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

FIG. 1 discloses a schematic overview of a vertical semiconductor device being a Metal Oxide Semiconductor, MOS, Field Effect Transistor, MOSFET 1.

At the left-hand side of FIG. 1, a traditional diagram of a MOSFET is shown, wherein the MOSFET comprises a gate terminal 10, a source terminal 9 and a drain terminal 11.

At the right-hand side of FIG. 1, the implementation of the MOSFET 1 in Silicon Carbide is depicted. The arrows 9, 10, 11 indicate the respective positions of the source terminal, the gate terminal and the drain terminal in the corresponding Silicon Carbide material.

The MOSFET is a vertical oriented MOSFET in the sense that the current flow vertically, i.e. between the source terminal 9 and the drain terminal 11.

Two well regions are provided in the Silicon Carbide material, one of which is indicated with the reference numeral 4. The well regions are of the P-type conductivity. In the well regions 4, source contacts 3 are provided for connection to the source terminal 9. The source contacts 3 are of the N-type conductivity.

The substrate 6 and the drift region 5 of the semiconductor material is also of the N-type conductivity, wherein the doping concentration of the drift region 5 is usually a bit lower than the doping concentration of the substrate 6.

The present disclosure defines a current-accommodating region which is indicated by the reference numeral 8. In accordance with the present disclosure, the current-accommodating region 8 is situated between the two well regions 4.

The channel 7 is created in the well regions 4 based on the voltage applied to the gate terminal 10. One the voltage at the gate terminal 10 is sufficiently high, a channel will occur to ensure that free carriers are able to move between the source contact 3 and the drain terminal 11. As such, current will flow between the source terminal 9 and the drain terminal 11.

The gate oxide is indicated with reference numeral 12 and the interlayer dielectric with reference numeral 2.

Figure 2:
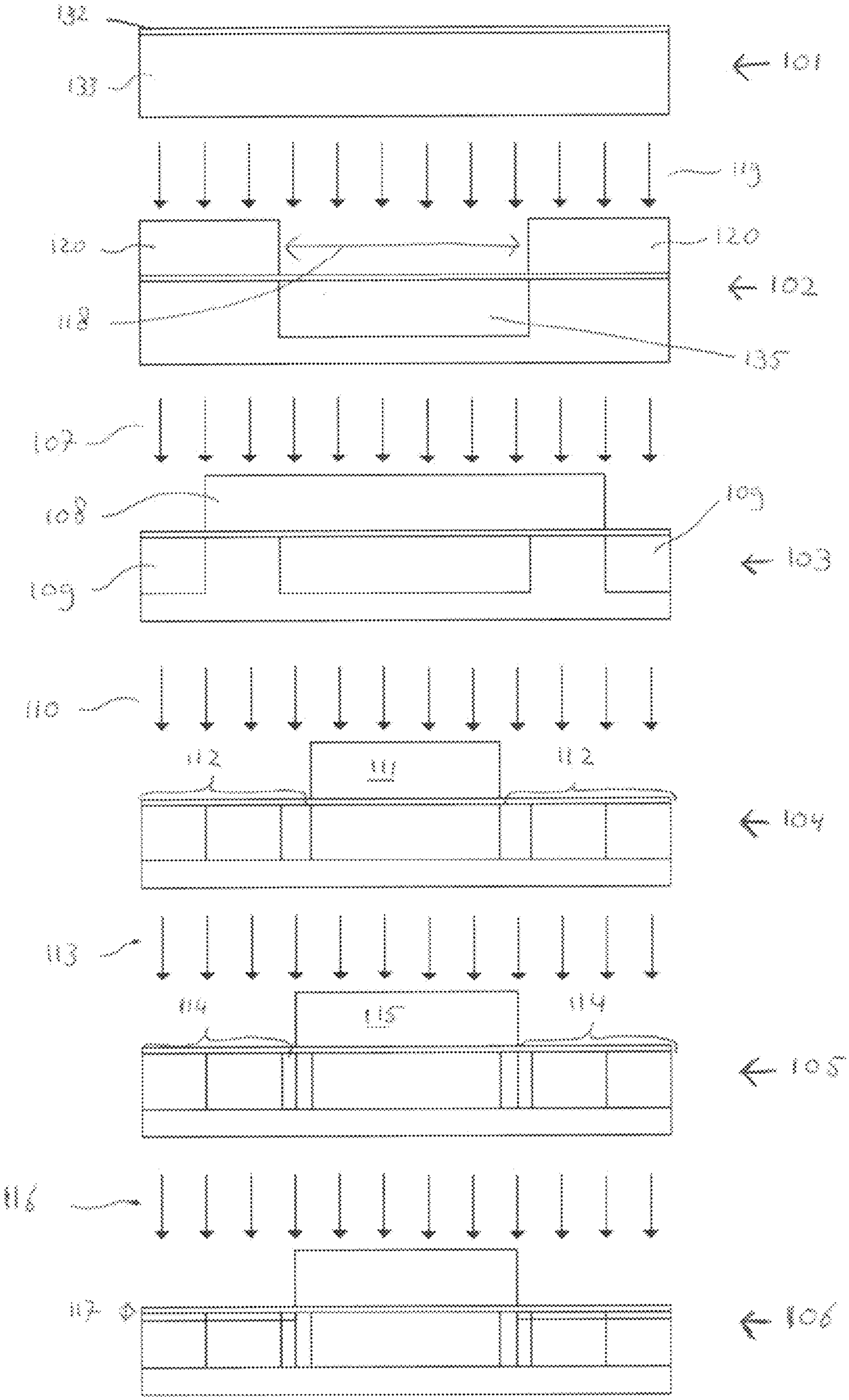
FIG. 2 discloses different method steps in manufacturing a vertical semiconductor device in accordance with the present disclosure.

FIG. 2 discloses different method steps in manufacturing a vertical semiconductor device in accordance with the present disclosure.

In a first step 101, a low doped semiconductor material 133 of a first conductivity type is provided as a base material and may be covered with a scattering oxide 132 to improve implant processes.

It is noted that, in step 102, the width 118 is defined as the area that is not protected for the implants, i.e. the area between the mask. In other examples, the width may refer to the width of the mask itself, i.e. the area that is protected for the implants. This is, however, clear from the figures.

In a second step 102, through a mask M1 120 with defined lateral dimensions Wcs 118 an implant A 119 of the first conductivity type is implanted to increase the doping above the level of the base material. This is visualized with reference numeral 135.

In a third step 103, with a mask M2 108 an implant B 107 of a second conductivity type is implanted with a dose higher than implant A 119. This is visualized with the reference numeral 109.

In a fourth step 104, using a mask M3 111, with a width smaller than the width Wcs 118 of the Implant A 119, another implant C 110 of the second conductivity type is implanted. The dose of implant C 110 counterdopes the implant A 119 of the first conductivity type in the overlapping regions.

Thus a lateral doping gradient with decreasing doping concentration towards the central current-accommodating region is created. By choosing the doping concentrations of Implant A 119, B 107 and C 110 to be $|A|<|C|<<|B|$ as well as the varying width of the of Masks 1,2,3, i.e. reference numerals 120, 109 and 111, in the range Wcs>Width M2>Width M3, the gradient can be tuned to balance the electric field crowding as well as the device performance and parasitics, for example the drain-source capacitance.

In a fifth step 105, a second implant of the second conductivity type, implant D 113, is implanted through a, preferably self-aligned, mask M4 115 with a width that is wider than the Mask M3 111. This mask width difference defines the length of the MOSFET channel of the device. If the M4 115 width is narrower than Wcs 118 this implant adds an additional step in the lateral doping variation that is controlled by the overlap and the doping levels of the Implant A, C and D. As a result the device has a lateral doping variation of multiple steps that are tunable in width and doping concentration.

The above-described method steps generate a lateral doping concentration in the well regions, as indicated with the reference numerals 112 and 114.

In a sixth step 106, a source contact is generated by using the same mask M4 for the implant E 116 with a dopant of the first conductivity type with a lower implant depth 117 than Implant A,B,C and D. This creates a source contact for the MOSFET. To keep the function of the body diode contact from implant B three approaches may be taken: 1. Implant E dose is lower than implants B+C+D. 2. The Mask M4 also covers the area above the implant B region or 3. By etching through the implant E implanted region in body diode contact regions.

Subsequent manufacturing of gate oxides, gate conduction line, interlayer dielectrics, ohmic contact etching and metallization as well as passivations are then done to finish the devices. These steps can vary and do not impact the function of the laterally manufactured doping gradient. An example of a manufactured device is shown in FIG. 3.

Figure 3:
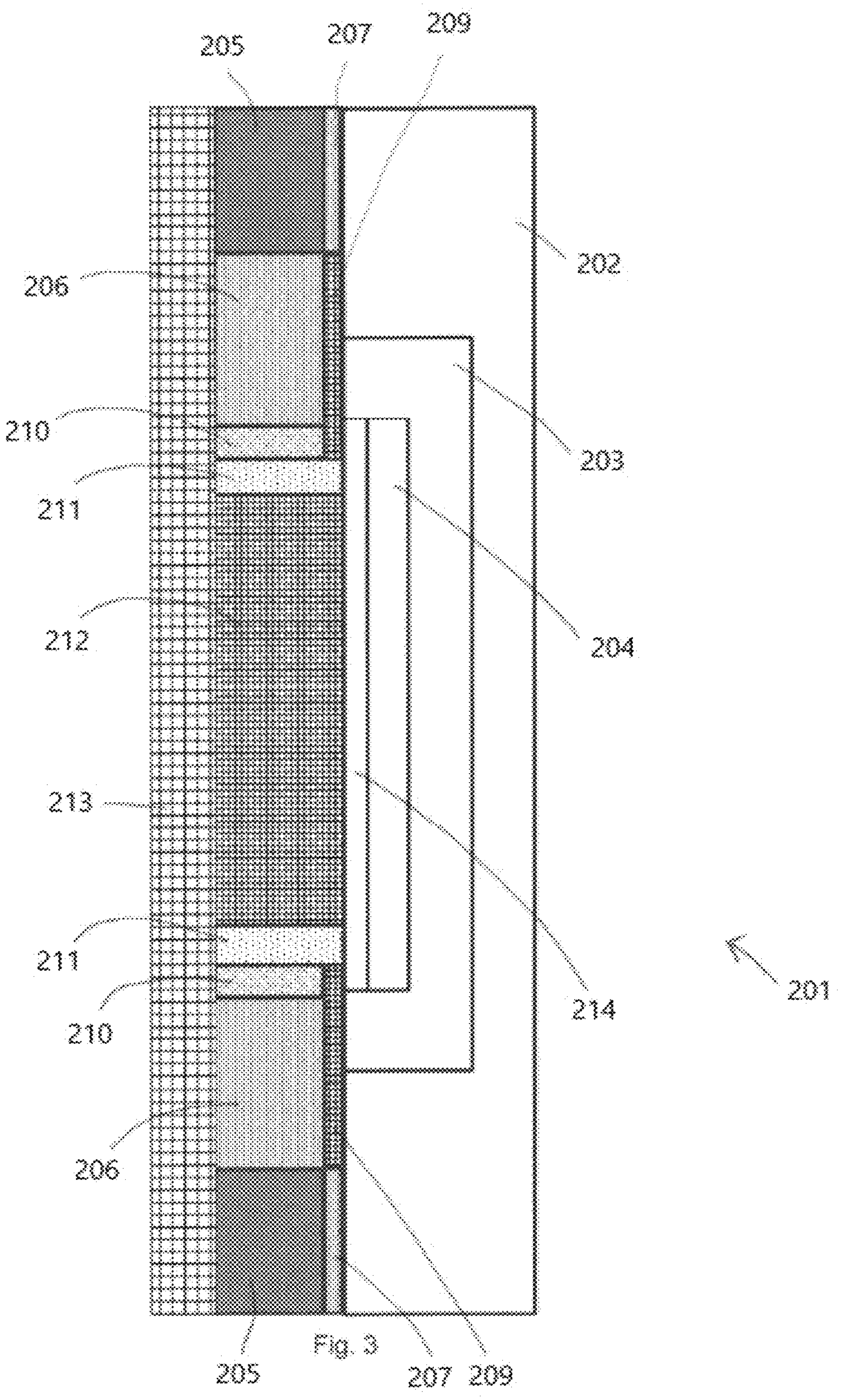
FIG. 3 discloses a schematic overview of a vertical semiconductor device being a MOSFET in accordance with the present disclosure.

FIG. 3 discloses a schematic overview of a vertical semiconductor device being a MOSFET in accordance with the present disclosure.

The semiconductor device 201 comprising a semiconductor body having a first major surface, said semiconductor device comprising:

- a current-accommodating region 212 of a first conductivity type;
- well regions 207, 205, 206, 210, 211 of a second conductivity type, at or near said first major surface, said second conductivity type opposite to said first conductivity type, said well regions laterally adjacent sides of said current-accommodating region 212, said well regions having a first depth into said semiconductor body;
- a substrate region 213, provided at a second major surface vertically opposite to said first major surface, said substrate region being of said first conductivity type;
- wherein at least one of said well regions has a lateral doping gradient with monotonic decreasing doping concentration, from a higher doping concentration at a first lateral end of said well regions towards a lower doping concentration at a second, opposite, lateral end thereof facing said current-accommodating region.

FIG. 2 discloses two well regions, one at each lateral side of the current-accommodating region 212. In accordance with the present disclosure a single well region may be viewed as the collection of the individual shaded areas as indicated with the reference numerals 207, 205, 206, 210, 211.

The lateral doping gradient is indicated with the different shadings. The doping concentration of the material indicated with reference numeral 205 has a higher doping concentration compared to the material having reference numeral 206 which again has a higher doping concentration as the material as indicated with reference numeral 210 which has a higher doping concentration as the material as indicated with reference numeral 211. The material as indicated with reference numeral 207 may be part of the well region as well. All of these materials combined may form a so-called P-well. The N-source contact is indicated with reference numeral 209. The drain contact is indicated with reference numeral 204 and has a gate oxide as indicated with reference numeral 214 and an interlayer dielectric as indicated with reference numeral 203. The N-source contact 209 may be connected to the source terminal 202.

FIG. 3 shows a lateral doping gradients with monotonic decreasing doping concentration in the well regions, from a higher doping concentration at a first end to a lower doping concentration at a second end, wherein the second end is facing the current-accommodating region 212.

In prior art doping geometries have been used to reduce electric field crowding but the geometry control alone limits the optimization of the overall device performance. By the use of overlapping implants in accordance with the present disclosure, well controlled doping gradients are manufactured that reduce electric field crowding that can be combined with geometrical features like steps. With this additional degree of freedom better device performance can be achieved.

In the above, the present disclosure is explained with respect to a vertical oriented Metal Oxide Semiconductor, MOS, Field Effect Transistor, FET. It is noted that the present disclosure may be applicable for any vertical oriented semiconductor device having at least one junction between semiconductor material of a first type and semiconductor material of a second type. It is further noted that the present disclosure is also applicable for a semiconductor device having no PN junction but having a transition between a metal part and a semiconductor material like, for example, a Schottky diode.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

LIST OF REFERENCE NUMERALS

1 Metal Oxide Semiconductor, MOS, Field Effect Transistor, MOSFET
2 Interlayer dielectric
3 Source terminal
4 Well region
5 Drift region
6 Substrate
7 Channel
8 Current-accommodating region
9 Source terminal
10 Gate terminal
11 Drain terminal
12 Oxide
101 First step
102 Second step
103 Third step
104 Fourth step
105 Fifth step
106 Sixth step
107 Implant B 107
108 Mask M2
109 Doping level
110 Implant C
111 Mask M3
112 Lateral doping gradient
113 Implant D
114 Lateral doping gradient
115 Mask M4
116 Implant E
117 Doping depth
118 Wcs
119 Implant A
120 Mask M1
132 Oxide
133 Semiconductor material
201 MOSFET
202 Source metal
203 Interlayer dielectric
204 Gate terminal
205 Part of well region
206 Part of well region
207 Part of well region
209 Source contact
210 Part of well region
211 Part of well region
212 Current-accommodating region
213 Substrate
214 Oxide

What is claimed is:

1. A method of manufacturing a vertical oriented semiconductor device, comprising the steps of:

providing a semiconductor body of a first conductivity type having a first major surface and having a current-accommodating region of the first conductivity type, the current-accommodating region being placed adjoining the first major surface;

implanting free charge carriers of a second conductivity type, the second conductivity type opposite to the first conductivity type, using a second mask on the semiconductor body, so that well regions of the second conductivity type are created at opposite lateral sides of the current-accommodating region;

wherein the implanting free charge carriers of the second conductivity type is performed, using the second mask and, subsequently, at least a third mask, so that at least one of the well regions has a lateral doping gradient with monotonic decreasing doping concentration, from a higher doping concentration at a first lateral end of the well regions towards a lower doping concentration at a second, opposite, lateral end thereof facing the current-accommodating region;

wherein the method further comprises the step of:

implanting free charge carriers of the first conductivity type using a first mask on the semiconductor body so that the current-accommodating region of the first conductivity type is created in the semiconductor body, wherein the second mask has a width larger than a width of the current-accommodating region; and wherein the third mask has a width smaller than a width of the second mask and smaller than a width of the current-accommodating region.

2. The method in accordance with claim 1, wherein the step of implanting free charge carriers of the second conductivity type further comprises implanting free charge carriers of the second conductivity using a fourth mask, and wherein the fourth mask has a width larger than a width of the third mask and smaller than a width of the second mask.

3. The method in accordance with claim 1, wherein the first conductivity type and the second conductivity type comprises any type selected from the group consisting of an N-type, and a P-type.

4. The method in accordance with claim 1, wherein the semiconductor body comprises a semiconductor material that is Silicon Carbide (SiC).

5. A vertical oriented semiconductor device obtained by a method in accordance with claim 1.

6. The method in accordance with claim 2, wherein the first conductivity type and the second conductivity type comprises any type selected from the group consisting of an N-type, and a P-type.

7. The method in accordance with claim 2, wherein the semiconductor body comprises a semiconductor material that is Silicon Carbide (SiC).

8. A vertical oriented semiconductor device obtained by a method in accordance with claim 2.

9. The method in accordance with claim 2, wherein the method comprises the step of:

implanting free charge carriers, of the first conductivity type, using the fourth mask, with a reduced implant depth compared to implant depths of the other implanting steps, so that source contacts are provided in the well regions.

10. The method in accordance with claim 9, wherein the first conductivity type and the second conductivity type comprises any type selected from the group consisting of an N-type, and a P-type.

11. The method in accordance with claim 3, wherein the semiconductor body comprises a semiconductor material that is Silicon Carbide (SiC).

12. A vertical oriented semiconductor device obtained by a method in accordance with claim 3.

13. The method in accordance with claim 3, wherein the method further comprises at least one step selected from the group consisting of:

manufacturing a gate oxide,
manufacturing a gate conduction line,
manufacturing interlayer dielectrics, and
manufacturing ohmic contacts.

14. The method in accordance with claim 4, wherein the first conductivity type and the second conductivity type comprises any type selected from the group consisting of an N-type, and a P-type.

15. The method in accordance with claim 9, wherein the semiconductor body comprises a semiconductor material that is Silicon Carbide (SIC).

16. A vertical oriented semiconductor device obtained by a method in accordance with claim 4.

17. The vertical oriented semiconductor device of claim 5, wherein the semiconductor body comprises a semiconductor material that is Silicon Carbide (SIC).

18. A vertical oriented semiconductor device obtained by a method in accordance with claim 13.

19. The method of claim 1, further comprising: implanting free charge carriers of the second conductivity type, using the second mask and, subsequently, at least the third mask, so that the well regions at the opposite lateral sides of the current-accommodating region each have the lateral doping gradient with the monotonic decreasing doping concentration, from the higher doping concentration at the first lateral end of the well region towards the lower doping concentration at the second, opposite, lateral end thereof facing the current-accommodating region.

* * * * *